US012648106B1

(12) United States Patent

Torabi et al.

(10) Patent No.: US 12,648,106 B1

(45) Date of Patent: Jun. 2, 2026

(54) REPLACEABLE INTERCONNECT CARTRIDGE WITH HANDLE AND GUIDE FOR TOP INSTALLATION

(71) Applicant: Amazon Technologies, Inc., Seattle, WA (US)

(72) Inventors: Hamid Torabi, Kirkland, WA (US); Vivek Surapaneni, Milpitas, CA (US)

(73) Assignee: Amazon Technologies, Inc., Seattle, WA (US)

( * ) Notice: Subject to any disclaimer, the term of this patent is extended or adjusted under 35 U.S.C. 154(b) by 96 days.

(21) Appl. No.: 18/732,411

(22) Filed: Jun. 3, 2024

(51) Int. Cl.
H05K 7/14 (2006.01)

(52) U.S. Cl.
CPC ......... H05K 7/1489 (2013.01); H05K 7/1492 (2013.01)

(58) Field of Classification Search
CPC ........................... H05K 7/1489; H05K 7/1492
See application file for complete search history.

(56) References Cited

U.S. PATENT DOCUMENTS

| | | | | |
|---|---|---|---|---|
| 10,264,701 | B1 * | 4/2019 | Norton | H05K 7/1424 |
| 11,363,747 | B2 * | 6/2022 | Tsorng | H05K 7/20172 |
| 2016/0050795 | A1 * | 2/2016 | Conn | G06F 1/183 |
| | | | | 454/184 |
| 2018/0049340 | A1 * | 2/2018 | Conn | G06F 1/181 |
| 2021/0120710 | A1 * | 4/2021 | Tsorng | F04D 29/601 |

* cited by examiner

*Primary Examiner* — Michael Pervan
(74) *Attorney, Agent, or Firm* — Kilpatrick Townsend & Stockton LLP

(57) ABSTRACT

A midplane frame may be contained in a rack-mountable enclosure and define at least a first bay. Guides may be distributed among a first cartridge and the midplane frame and arranged to facilitate aligned vertical movement of the first cartridge along a height direction into a landed position in the first bay. The first cartridge may have forwardly-oriented connectors arrayed in rows arranged in a stack in a height direction. A plurality of appliances may each have a row of one or more rearwardly-oriented connectors, and each of the appliances may be movable rearwardly along a length direction in the enclosure into a seated arrangement in which the appliances are stacked over one another in the height direction and in which the rows of rearwardly-oriented connectors of the appliances are coupled with the rows of the forwardly-oriented connectors of the first cartridge in the landed position.

20 Claims, 9 Drawing Sheets

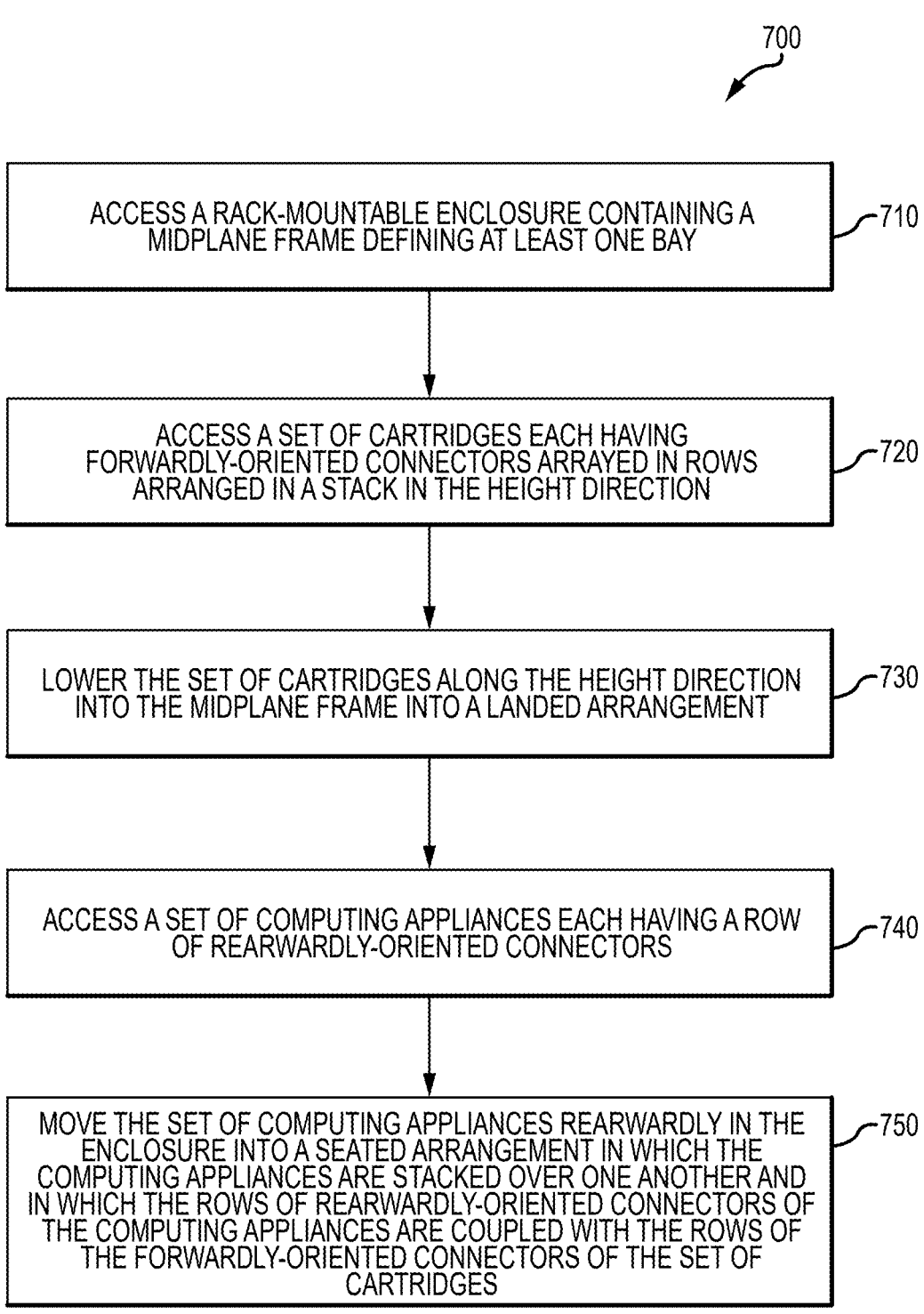

700

ACCESS A RACK-MOUNTABLE ENCLOSURE CONTAINING A
MIDPLANE FRAME DEFINING AT LEAST ONE BAY — 710

ACCESS A SET OF CARTRIDGES EACH HAVING
FORWARDLY-ORIENTED CONNECTORS ARRAYED IN ROWS
ARRANGED IN A STACK IN THE HEIGHT DIRECTION — 720

LOWER THE SET OF CARTRIDGES ALONG THE HEIGHT DIRECTION
INTO THE MIDPLANE FRAME INTO A LANDED ARRANGEMENT — 730

ACCESS A SET OF COMPUTING APPLIANCES EACH HAVING A ROW
OF REARWARDLY-ORIENTED CONNECTORS — 740

MOVE THE SET OF COMPUTING APPLIANCES REARWARDLY IN THE
ENCLOSURE INTO A SEATED ARRANGEMENT IN WHICH THE
COMPUTING APPLIANCES ARE STACKED OVER ONE ANOTHER AND
IN WHICH THE ROWS OF REARWARDLY-ORIENTED CONNECTORS OF
THE COMPUTING APPLIANCES ARE COUPLED WITH THE ROWS OF
THE FORWARDLY-ORIENTED CONNECTORS OF THE SET OF
CARTRIDGES — 750

FIG.7

REPLACEABLE INTERCONNECT CARTRIDGE WITH HANDLE AND GUIDE FOR TOP INSTALLATION

BACKGROUND

Datacenters house collections of servers and networking hardware, including switches and routers. Many different connections between components may be used to, for example, permit data or power transfer between the components. The manner in which connections are managed can become a significant factor in datacenter operations, especially as the structure of connections can have corresponding costs to supply, install, test, and/or maintain equipment.

BRIEF DESCRIPTION OF THE DRAWINGS

Various embodiments in accordance with the present disclosure will be described with reference to the drawings, in which:

FIG. 7 is a block diagram illustrating a process that may be performed relative to components of the system of FIG. 1 according to various embodiments.

DETAILED DESCRIPTION

Various embodiments herein are directed to connection structures and associated components for computing equipment, such as may be used in computer networks for data centers or other locations. The connection structures can include cartridges and/or other modular structures that can be installed relative to enclosures in suitable positions to provide connection between appliances such as computer servers, networking hardware components, or other computing devices.

The cartridges can be part of a modular arrangement that may facilitate rapid installation and connection of the appliances to one another within the enclosure. For example, the enclosure can include a midplane frame with suitable vertical guides to align and position the cartridges into a landed state. In the landed state, forwardly-oriented connectors may extend from the cartridges in rows. The appliances may include matching rows of rearwardly oriented connectors, such that sliding a given appliance backward into the enclosure will cause at least one row of the appliance to engage with at least one row of the cartridge or cartridges. Cabling and/or electronics boards (such as a printed circuit board) may be included in the cartridges to enable communication among the appliances through the cartridges. As an illustrative example, one cartridge may include cabling and an electronics board with a clock generator, a second cartridge may include cables for a point-to-point processor interconnect, and a third cartridge may include cabling and an electronics board with an ethernet switch.

The cartridges may include suitable features to facilitate rapid and/or simple installation procedures. As one example, the cartridges may include a handle on top to allow a technician or other user to be able to lower or raise the cartridge relative to the midplane without contorting and/or inserting a hand into internal spaces of the enclosure to achieve installation. The handle may be hinged to allow the handle to fold flat along a top of the cartridge and thus avoid occupying space that may be at a premium in the enclosure. As another example, the cartridges may include hangers that hold pre-mounted fasteners. Inserting the cartridges along vertical guides may position the fasteners in an appropriate position to be driven into underlying structure to secure the cartridges without involving additional operations of maintaining a separate supply of fasteners and/or individually grasping, aligning, and inserting fasteners during installation.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
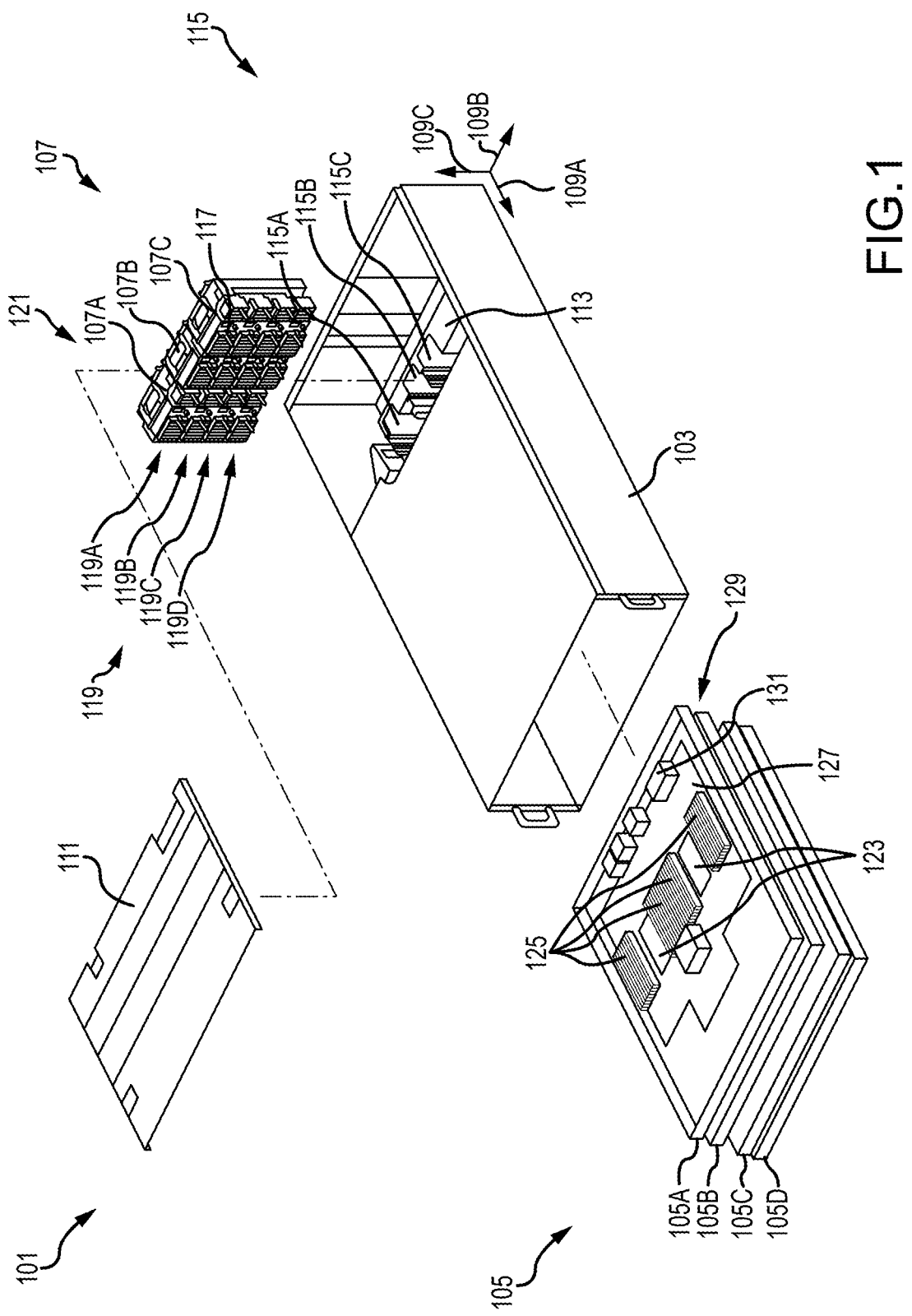
FIG. 1 depicts a partially exploded assembly view of components of a system including cartridges for interconnecting appliances received within an enclosure according to various embodiments.

FIG. 1 depicts a system 101. The system 101 is shown with one enclosure 103, four appliances 105, and three cartridges 107, although fewer, more, or different components may be utilized. Generally, the cartridges 107 may correspond to modular structures that may be installed into the enclosure 103 (e.g., in a top-down direction) and into a suitable position so that pushing the appliances 105 into the enclosure 103 (e.g., in a horizontal direction) will cause the appliances 105 to engage the cartridges 107 so that communication may be established between the appliances 105 by way of the cartridges 107. Features may be included that facilitate modular arrangements and/or otherwise allow the cartridges 107 to be readily installed and/or uninstalled, which may provide labor-related benefits, such as allowing technicians to perform operations quickly (and thus at lower cost) and/or simply (such as without involving reaching significantly into the enclosure and thus providing favorable ergonomics).

The enclosure 103 may extend in a length direction 109A, a width direction 109B, and a height direction 109C. In use, the height direction 109C may be aligned along a vertical direction (e.g., generally aligned with a direction of gravity), the length direction 109A may be aligned along a forward or rearward direction (or a longest dimension of the enclosure 103), and the width direction 109B may be arranged along lateral direction (e.g., a leftward or rightward direction), although it will be understood that the relative orientations of these and/or any other directions herein are described by way of example only, and any suitable relative orientation may be utilized. The enclosure 103 may include panels defining a top, bottom, and lateral sides. The panels may include sheet-metal or other suitable material. The top may include a lid 111, which may be removable to provide access into the enclosure 103, such as into a rear, middle, or other relevant portion of the enclosure 103.

The enclosure 103 may be rack-mountable. For example, the enclosure 103 may be mounted to be slidable or stationary relative to a server rack or other form of rack, which may include suitable structure for supporting the enclosure 103 and/or other components. Suitable rails, tracks, or other fasteners may be used to mount the enclosure 103 to the rack. In some embodiments, the enclosure 103 may be sized to be approximately 4U in the height direction 109C (e.g., where each U may correspond to approximately 1.75 inches or 4.45 centimeters pursuant to industry terminology), although other suitable dimensions in the length direction 109A, the width direction 109B, and/or the height direction 109C may be utilized.

A set of one or more cartridges 107 (e.g., a cartridge set) can be utilized. The cartridges 107 in FIG. 1 are shown with a first cartridge 107A, a second cartridge 107B, and a third cartridge 107C. Generally, the cartridges 107 may include forwardly-oriented connectors 117. The forwardly-oriented connectors 117 may be arrayed in a number of rows 119 arranged in a stack in the height direction 109C. For example, in FIG. 1, the forwardly-oriented connectors 117 are arrayed in four rows 119 (e.g., including a first row 119A, a second row 119B, a third row 119C, and a fourth row 119D). Other examples of components that may be included in the cartridges 107 are also discussed with respect to later figures herein.

A midplane frame 113 may be contained within the enclosure 103. The midplane frame 113 may have a greatest dimension in the width direction 109B and/or may extend at least in the width direction 109B. The midplane frame 113 may be sized and/or equipped with suitable features to facilitate engagement with one or more of the cartridges 107. For example, the midplane frame 113 may define one or more bays 115 that may include at least a first bay 115A (e.g., which may be sized to receive a first cartridge 107A). The midplane frame 113 may further define a second bay 115B (e.g., which may be sized to receive a second cartridge 107B) and a third bay 115C (e.g., which may be sized to receive a third cartridge 107C). The first bay 115A, the second bay 115B, and the third bay 115C may be aligned alongside one another in the width direction 109B, for example. The cartridges 107 may be receivable into the bays 115, e.g., respectively sized for receipt in different instances of the bays 115.

A vertical guide set 121 may include guides distributed among the first cartridge 107A and the midplane frame 113 and arranged to facilitate aligned vertical movement of the first cartridge 107A along the height direction 109C into and out of the first bay 115A. Further examples of structures that may be included in the vertical guide set 121 are discussed with respect to later figures herein. More generally, the vertical guide set 121 may include at least some guides that are distributed among the midplane frame 113 and the set of cartridges 107 (such as along the first cartridge 107A, the second cartridge 107B, the third cartridge 107C, and/or any other combination of more, fewer, or different cartridges 107 that may be included). Overall, the vertical guide set 121 may facilitate aligned vertical movement into a landed arrangement in which the set of cartridges 107 is received in the midplane frame 113.

In use, installation may be performed at least in part by lowering the set of cartridges 107 along the height direction 109C into the midplane frame 113. For example, the lowering may include lowering the first cartridge 107A into the first bay 115A, lowering the second cartridge 107B into the second bay 115B, and lowering the third cartridge 107C into the third bay 115C. The set of cartridges 107 may be lowered into a landed arrangement in the midplane frame 113. In the landed arrangement, the set of cartridges 107 may be received in the midplane frame 113 with the rows 119 of forwardly-oriented connectors 117 aligned across the set of cartridges 107. For example, similar to the relative arrangement of cartridges 107 shown in the exploded view in FIG. 1, the cartridges 107 in the landed arrangement in the midplane frame 113 may be aligned next to each other such that the four rows 119A, 119B, 119C, and 119D of forwardly-oriented connectors 117 are aligned across the set of cartridges 107.

The appliances 105 may correspond to computing appliances. For example, the appliances 105 may include one or more processors 123, one or more memory devices 125, one or more motherboards 127, and/or other computing components. The appliances 105 may include similar or different arrangements and/or combinations of components. As an illustrative example, the top or first appliance 105A is shown with the motherboard 127 supporting a two socket arrangement in which each socket includes a processor 123 accompanied by various corresponding memory devices 125 on each lateral side (e.g., which may yield a total of thirty-two memory devices in the first appliance 105A when each processor 123 includes eight memory devices 125 on each side), and the second appliance 105B, the third appliance 105C, and the fourth appliance 105D may include similar arrangements to provide an overall setup with one-hundred-twenty-eight memory devices 125 and eight processors 123 (which, when suitably connected in use, may provide 32 tebibytes of memory when 256 gigabyte dual in-line memory module (DIMM) are utilized for the memory devices 125). However, other system level parameters and/or combinations of components may also be implemented. As another illustrative example, rather than an eight-socket arrangement just described, the system 101 may be utilized to implement a four-socket arrangement, such as by using half the number of appliances 105, e.g., just the first appliance 105A and the second appliance 105B in similar configurations engaged with two rows 119A of forwardly-oriented connectors 117 of the set of cartridges 107 (e.g., in a subset of rows such as two of four rows, or in all rows if cartridges 107 are instead supplied with only two rows). More generally, the appliances 105 can include computer servers, network hard drive components, network switches, or other network hardware components or other appliance for a datacenter or other environment. In some embodiments, the appliances 105 may correspond to a single type of component (e.g., all servers) or may include combinations of different types of components (e.g., some network switches and some servers). Examples of computing components that may be included within the appliances 105 a printed circuit board, a fan, a solid state drive (SSD), a hard disk drive (HDD), a graphics processing unit (GPU), a heat sink, a cable, a connector, an interface, and/or other elements that may contribute to the operability of the appliance 105. Although listed individually, any of such components may be present singly or in multiples (or absent).

The appliances 105 may include suitable structure to facilitate communication between appliances 105 and/or other structures. For example, each appliance 105 may include a row 129 of one or more rearwardly-oriented connectors 131. The rearwardly-oriented connectors 131 may be in communication with the processors 123 and/or the memory devices 125 via the motherboard 127 and/or via other suitable paths.

In use, moving the set of appliances 105 rearwardly along the length direction 109A may move the appliances 105 in the enclosure 103 into a seated arrangement. In the seated arrangement, the appliances 105 may be stacked over one another in the height direction 109C. Further, in the seated arrangement, the rows 129 of the rearwardly-oriented connectors 131 of the appliances 105 may be coupled with the rows 119 of the forwardly-oriented connectors 117, such as of the first cartridge 107A. Additionally or alternatively, the rows 129 of the rearwardly-oriented connectors 131 of the appliances 105 may be coupled with the rows 119 of the forwardly-oriented connectors 117 of the second cartridge 107B, and/or of the third cartridge 107C. As a whole, in the seated arrangement, the rows 129 of rearwardly-oriented connectors 131 of the four computing appliances 105 may be coupled with the four rows 119 of the forwardly-oriented connectors 117 of the set of cartridges 107. For example, the first appliance 105A may engage the first row 119A of the cartridges 107, the second appliance 105B may engage the second row 119B of the cartridges 107, the third appliance 105C may engage the third row 119C of the cartridges 107, and the fourth appliance 105D may engage the fourth row 119D of the cartridges.

The forwardly-oriented connectors 117 of the set of cartridges 107 and the rearwardly-oriented connectors 131 of the computing appliances 105 can correspond to opposite mating components of a connection interface that are sized and arranged for engaging one another or may correspond to compatible structures that may be engaged through suitable couplers. The connection interface can facilitate blind-mate engagement, for example. Any suitable male and female portions of the connection interface may be included and may correspond to any suitable set of projections, recesses, or other connecting structure. For example, while in some examples one side may have projections or pins insertable into holes or pin-holes in an opposite side, either or both of the sides (or an intervening coupler) may include some protruding structure that is receivable within an opening, may include an opening or other suitable complementary structure suitable for receiving a protrusion from a mating component, or may include some combination of protrusion and receiving structure. Connecting structure may be flush, recessed into, and/or projecting out from a reference surface. Implemented structures may include any suitable form of connector. These may correspond to any suitable form factor of pluggable module, pluggable media, pluggable transceiver, or other pluggable component. For example, these may be sized and arranged to meet any suitable standard for pluggable optical transceivers. In one non-limiting example, one or more may correspond to a small form-factor pluggable (SFP) transceiver, such as is commonly used for telecommunication and/or data communications applications. In another non-limiting example, one or more comprises an enhanced small form-factor pluggable (SFP+) transceiver or a compact small form-factor pluggable (CSFP) transceiver. In an additional non-limiting example, one or more comprises an RJ45 connector or a similar connector. Further non-limiting examples may include QSFP, QSFP+, QSFP28, QSFP56, QSFP56-DD, OSFP, or other standards that may be implemented in the art.

Overall, elements of the system 101 may enable connectivity between computing components of the appliances 105, such as to allow the appliances 105 to operate as a single system. The cartridges 107 may provide a point-to-point processor interconnect, for example. In some embodiments, the cartridges 107 may allow the system 101 to operate as an 8-socket system, a 4-socket system, or other form of system.

Implementing components relative to the cartridges 107 may facilitate case of installation, testing, and/or maintenance. For example, cartridges 107 may be capable of being tested separately from appliances 105, and/or elements within the cartridges 107 may be readily removable from the cartridge 107 and/or otherwise readily accessible with the cartridge 107 separate from other elements of the system 101, which may facilitate testing and/or replacing of individual subcomponents.

Figure 2A:
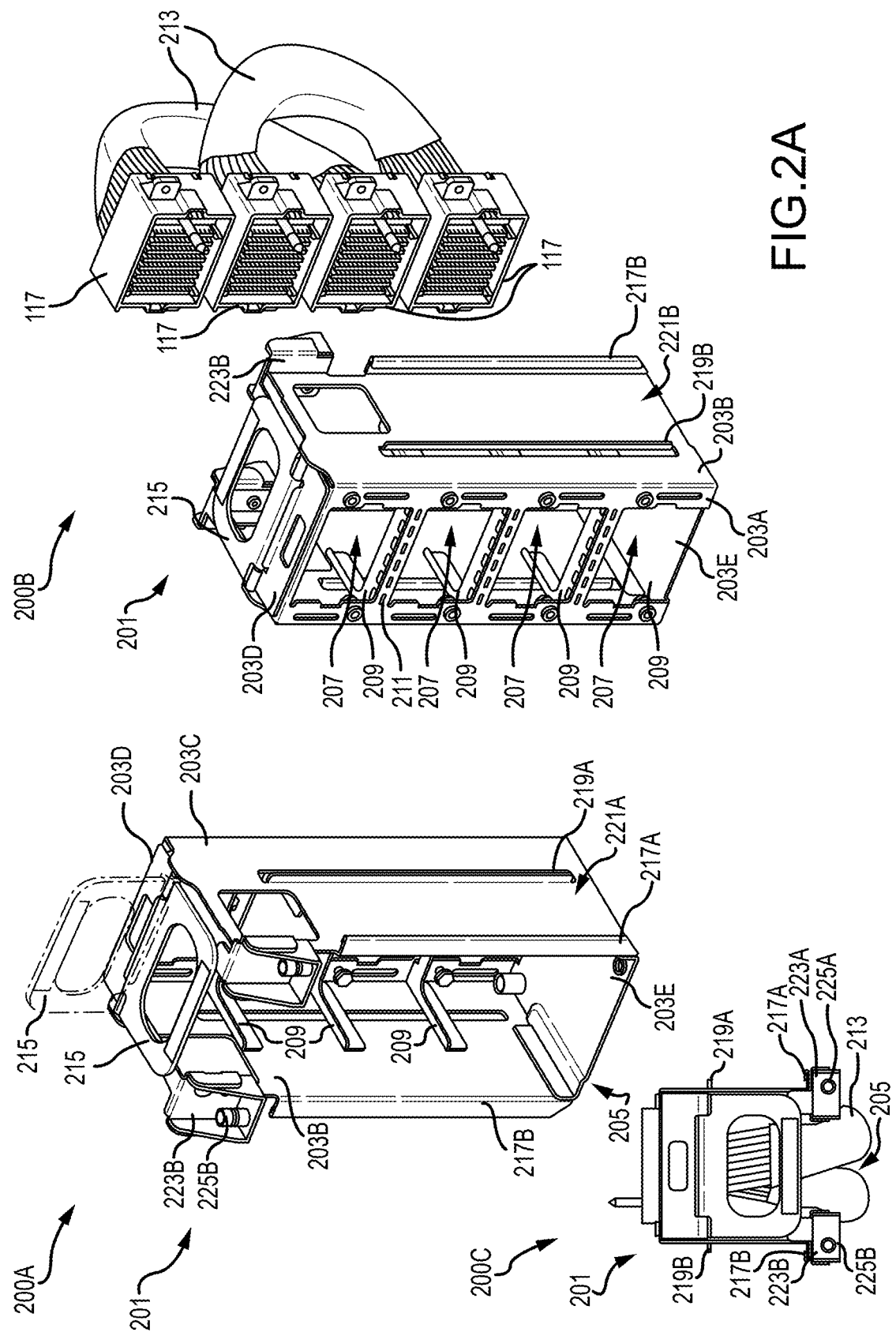
FIGS. 2A and 2B depict various views of components that may be included in one cartridge in a cartridge set that may be used in the system of FIG. 1 according to various embodiments.
Figure 2B:
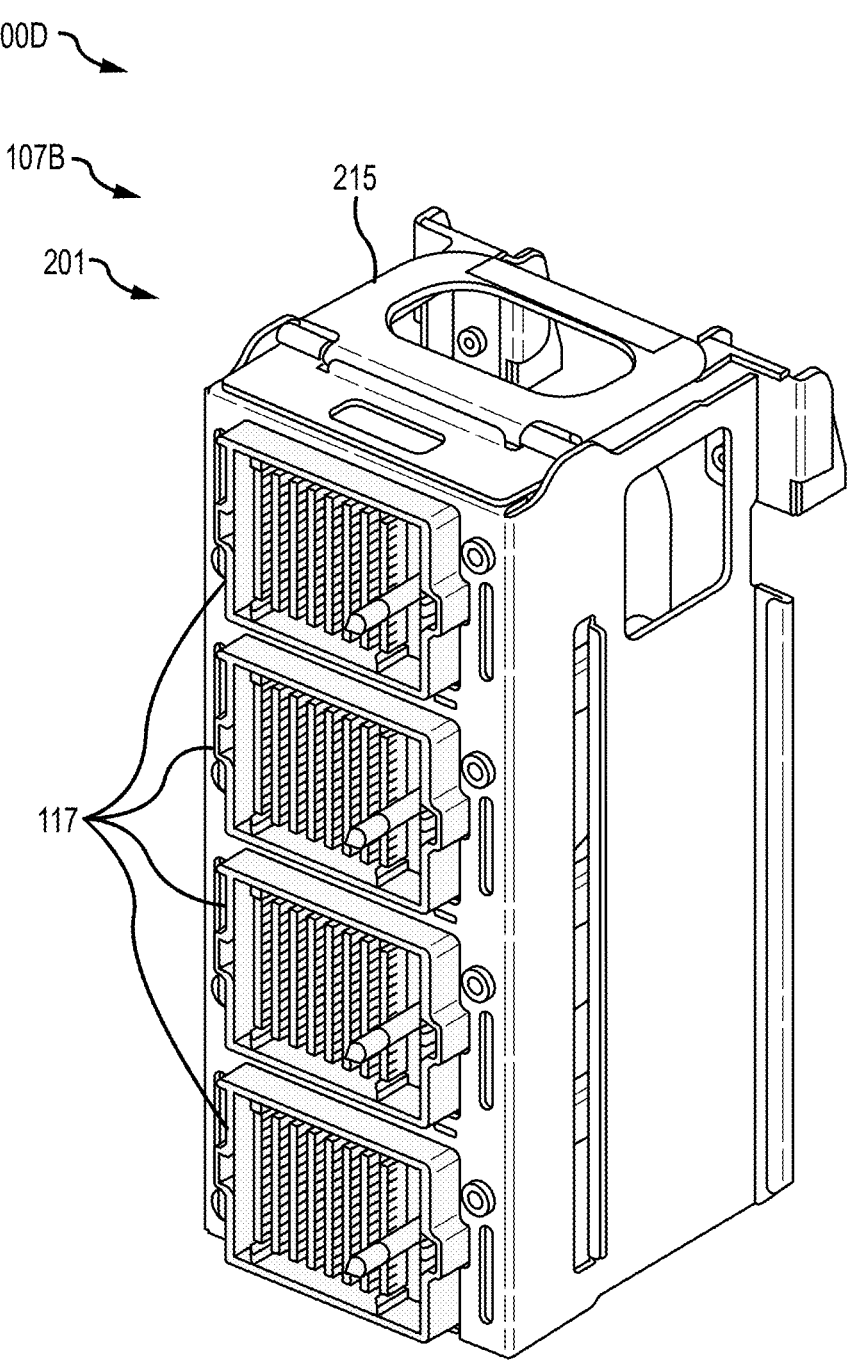

FIGS. 2A and 2B depict various views of components that may be included in the set of cartridges 107 in the system 101 depicted in FIG. 1. For example, structure depicted in FIGS. 2A and 2B may correspond to structure of the second cartridge 107B and/or other cartridge 107. FIGS. 2A and 2B include a perspective view 200A, an exploded view 200B, a top view 200C, and an assembled view 200D.

The cartridge 107 may include a body 201. The body 201 is shown in isolation in the perspective view 200A and with other components in the exploded view 200B, the top view 200C, and the assembled view 200D.

The body 201 may include suitable structure to accommodate, receive, and/or engage other components. In various embodiments, the body 201 may include metal (e.g., sheet metal) or other material exhibiting suitable formability and durability characteristics.

The body 201 may include a front wall 203A, lateral side walls 203B and 203C (e.g., a right side wall 203B and a left side wall 203C), and a top wall 203D. A bottom wall 203E may further be included. The body 201 may further include an open rear face 205.

The front wall 203A may be penetrated by openings 207. The openings 207 may be distributed in the height direction 109C. The openings 207 may be sized for receiving connectors, such as the forwardly-oriented connectors 117. For example, the forwardly-oriented connectors 117 may be arranged in the openings 207 to extend through the openings 207 and/or to otherwise be accessible and/or engageable from a position that is in front of the front wall 203A and is facing toward the front wall 203A. The open rear face 205 may be arranged opposite the openings 207, which may facilitate introducing the forwardly-oriented connectors 117 through the open rear face 205 during installation and/or movement toward the openings 207. The body 201 may include or be coupled with a set of shelves 209 each positioned below a different one of the openings 207. For example, the shelves 209 may each be sized for supporting one of the forwardly-oriented connectors 117 in a position extending through and/or along the front wall 203A. In some examples, the bottom wall 203E may function as and/or form one of the shelves 209.

Any suitable technique may be utilized for securing the forwardly-oriented connectors 117 relative to the openings 207. In the depicted example, the front wall 203A and the forwardly-oriented connectors 117 are depicted with matching apertures for receiving a rivet or other fastener, although other fastening structures may be utilized.

In some examples, airflow passages 211 are defined through portions of the front wall 203A between the openings 207. For example, when the forwardly-oriented connectors 117 have been mounted into the body 201, the forwardly-oriented connectors 117 may at least partially obstruct airflow through the openings 207, and the airflow passages 211 may allow or facilitate airflow through the body 201 (e.g., past the forwardly-oriented connectors 117).

Cabling 213 may be included. The cabling 213 may couple subsets of the forwardly-oriented connectors 117 together. In some examples, the open rear face 205 may be sized to permit extension of the cabling 213 in an installed state, such as may be appreciated in the top view 200C.

A foldable handle 215 may be coupled with the top wall 203D of the body 201. The foldable handle 215 may be secured by a hinge pin or may be otherwise reconfigurable between a stowed arrangement and a deployed state.

In the stowed arrangement (e.g., which may correspond to the position shown in solid lines in view 200A), the handle 215 may be arranged laying flat along or within the top wall 203D. For example, the handle 215 may be arranged to overlay the top wall 203D and/or may be arranged to lay within a depression of the top wall 203D (e.g., so as to form a continuation of the top wall 203D). In use, with the body 201 in the landed arrangement, the handle 215 may be folded down to the stowed state, which may cause the handle 215 to be positioned atop the body 201 and/or otherwise out of the way of securing the lid 111 on the enclosure 103.

In the deployed arrangement (e.g., which may correspond to the position shown in phantom lines in view 200A), the handle 215 may be arranged extending upward from the top wall 203D. Extending upward may facilitate grasping or holding from above for lowering or raising the body 201 relative to the midplane frame 113, such as for installation and/or removal from one of the bays 115. Having a surface of the handle 215 to grasp may allow a user to lower the body 201 into the enclosure 103 without also introducing the user's hand into the enclosure 103, for example.

The body 201 is also shown with lateral wings 217A and 217B and lateral arms 219A and 219B. The lateral wings 217A and 217B and the lateral arms 219A and 219B are shown extending outwardly from the lateral side walls 203B and 203C. The lateral wings 217A and 217B are shown as tabs positioned at an edge of the rear face 205 (such as formed by folding trailing margins of the lateral side walls 203B and 203C), while the lateral arms 219A and 219B are shown positioned in a middle portion of the lateral side walls 203B and 203C (such as formed by folding a flap cut from the lateral side walls 203B and 203C), although any other suitable positioning or formation technique may be implemented to enable any of the lateral wings 217A and 217B and/or the lateral arms 219A and 219B to be suitably sized for being received in other structure and/or receiving other structure. One slot 221A is depicted formed and/or bounded in a space between the lateral wing 217A and the lateral arm 219A, while another slot 221B is depicted formed and/or bounded in the lateral wing 217B and the lateral arm 219B. Any of the lateral wings 217A, 217B, the lateral arms 219A, 219B, and/or the slots 221A, 221B may be examples of guides included in the vertical guide set 121.

Suitable structure may be included for securing the body 201. For example, the body 201 is shown with a first hanger 223A and a second hanger 223B (although any number may be utilized). Each hanger 223 may correspond to a surface extending from and/or incorporated into the body 201 and bearing a fastener (e.g., fastener 225A or fastener 225B) that may be utilized to secure the body 201 in the landed arrangement. In various embodiments, the fasteners may correspond to thumb screws and/or otherwise may be configured for keyless or tool-less operation. For example, the fasteners may include plungers or other structure that may allow engagement by pushing down and twisting by hand and/or pulling up and twisting an opposite direction to disengage. The fasteners additionally or alternatively may include a driving interface, such as to receive a screwdriver tip or other tool tip. In some examples, the fasteners may include a driving interface along with features for tool-less operation, e.g., such that an operator may have an option for driving by hand or by a tool in use. The fasteners may correspond to captive fasteners, e.g., which may be pre-mounted or otherwise retained in position relative to the first hanger 223A, the second hanger 223B, and/or other portion of body 201, such as to facilitate case of installation by avoiding additional operations of locating and installing loose, unconnected, or otherwise separate fasteners in use. The first hanger 223A and the second hanger 223B are each shown arranged along and/or extending beyond the rear open face 205, although other positioning relative to features of the body 201 may be implemented.

Figure 3A:
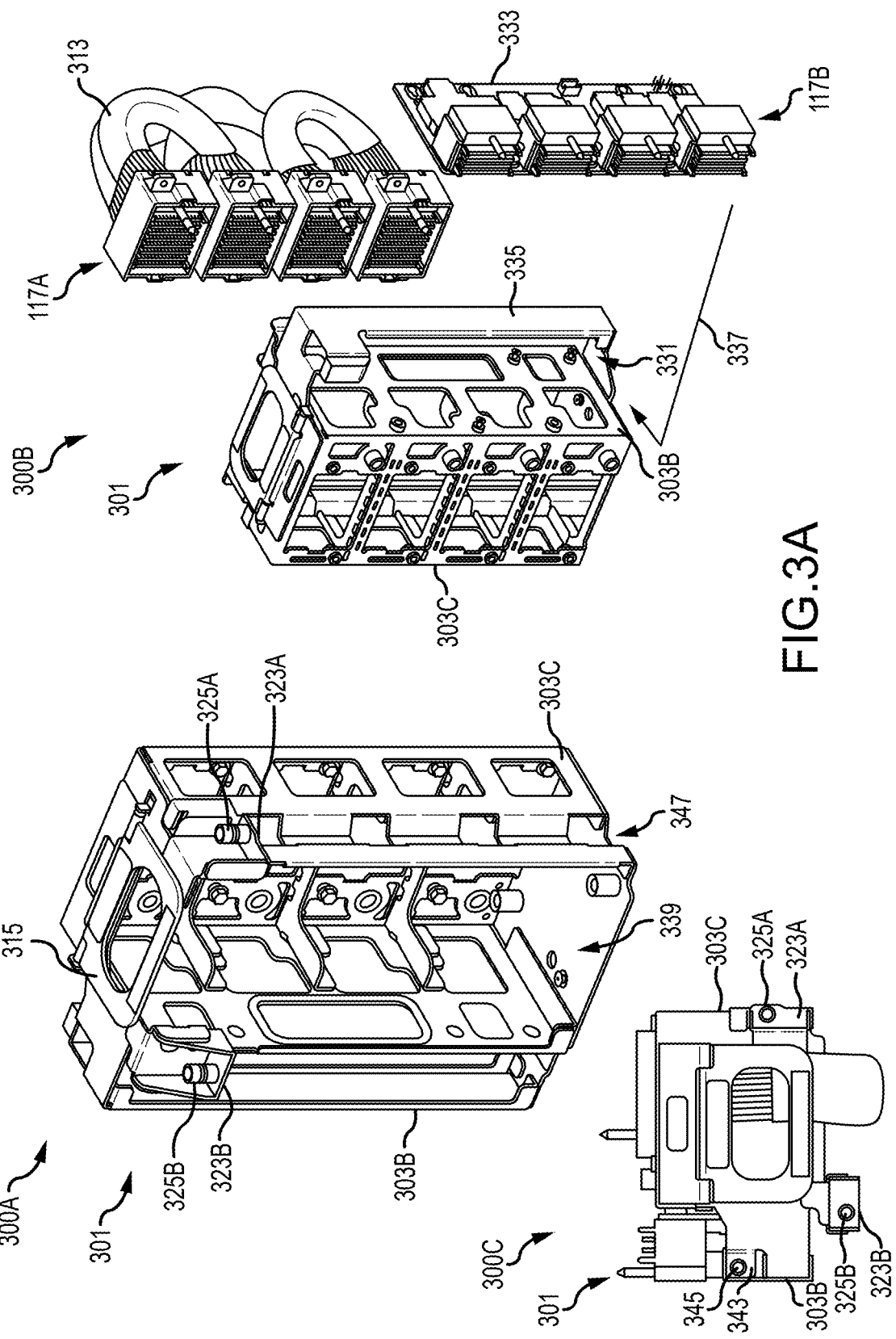
FIGS. 3A and 3B depict various views of components that may be included in another cartridge in a cartridge set that may be used in the system of FIG. 1 according to various embodiments.
Figure 3B:
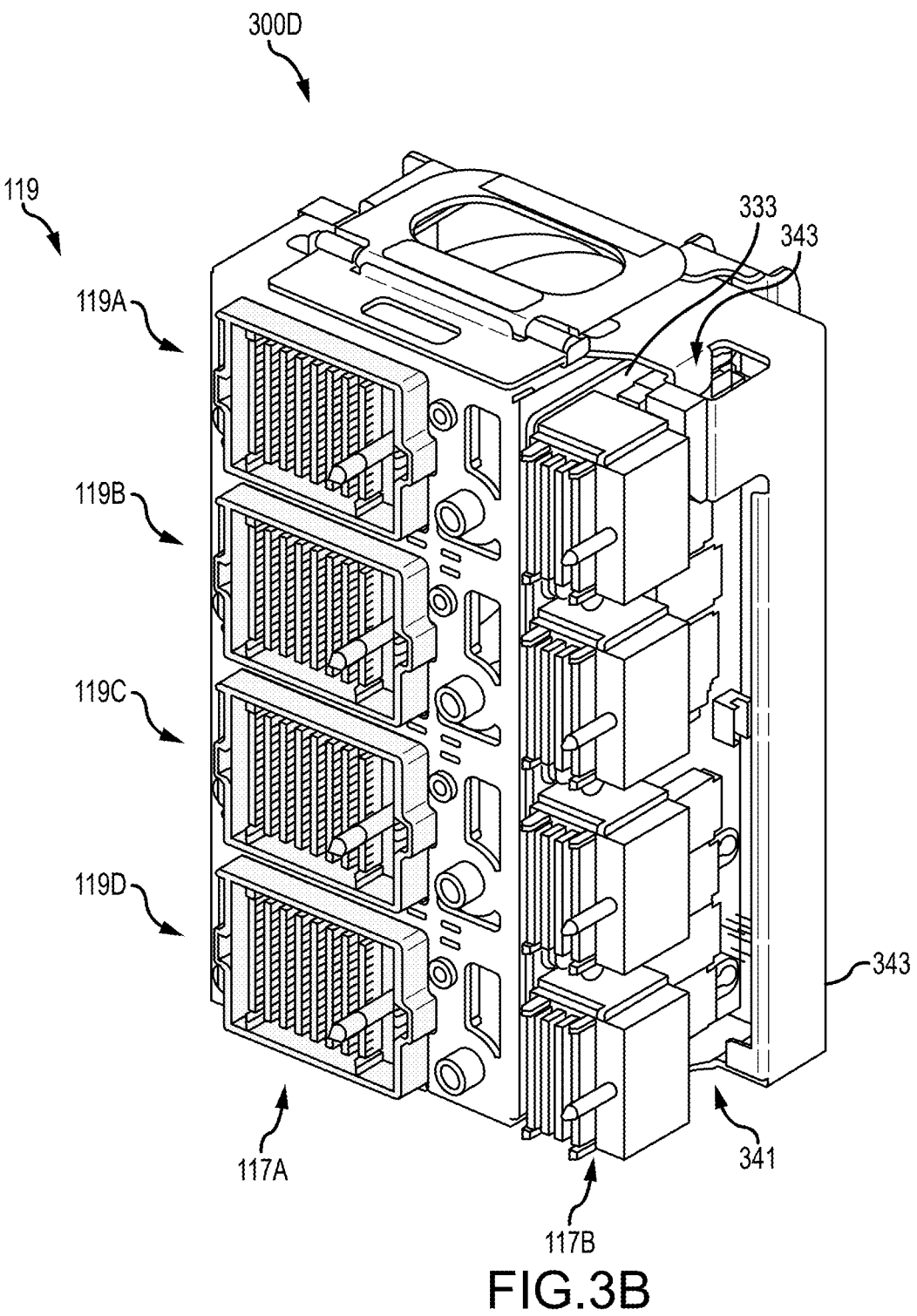

FIGS. 3A and 3B depict various views of other components that may be included in the set of cartridges 107 in the system 101 depicted in FIG. 1. For example, structure depicted in FIGS. 3A and 3B may correspond to structure of the first cartridge 107A, the third cartridge 107C, and/or another cartridge 107. FIGS. 3A and 3B include a perspective view 300A, an exploded view 300B, a top view 300C, and an assembled view 300D.

The cartridge 107 may include a body 301. The body 301 is shown in isolation in the perspective view 300A and with other components in the exploded view 300B, the top view 300C, and the assembled view 300D.

Various features implemented relative to the body 301 may be similar to features implemented relative to the body 201 with similar names and/or reference numbers, and corresponding discussion will accordingly not be repeated. Features may also differ in aspects, including, but not limited to, those discussed further below.

The body 301 may include a channel 331 sized for receiving an electronics board 333 (e.g., which may be a printed circuit board). For example, the body 301 may include a cover 335 spaced apart from the right lateral side wall 303B to define a channel 331 between the cover 335 and the right lateral side wall 303B. The electronics board 333 may be arranged to be aligned and slide into the channel 331, such as illustrated by arrow 337, for example. The electronics board 333 may correspond to an active component, while cabling 313 may correspond to a passive component, although more generally, any combination of passive components and/or active components may be implemented.

The electronics board 333 may include a secondary set 117B of forwardly-oriented connectors 117, e.g., which may be distinct from a primary set 117A of forwardly-oriented connectors 117 that may be included with cabling 313. The primary set 117A and the secondary set 117B may each be examples of the forwardly-oriented connectors 117 and may be alike or differ in terms of type of interface or structure included. The channel 331 may be sized for receiving the electronics board 333 in a position with the secondary set 117B of forwardly-oriented connectors 117 of the electronics board 333 aligned in rows 119 with the primary set 117A of forwardly-oriented connectors 117 positioned in the openings 307 in an installed state (such as most readily seen in view 300D).

Different forms of the electronics board 333 may be used to provide different functions for different cartridges 107. As an example, the first cartridge 107A may include an electronics board 333 that includes or incorporates a clock generator (e.g., such that appliances 105 when seated may be connected to the clock generator). As another example, the third cartridge 107C may include an electronics board 333 that includes or incorporates an ethernet switch (e.g., such that the appliances 105 when seated may be connected to the ethernet switch). Other elements or features additionally or alternatively may be included in differing instances included with the electronics board 333 in different cartridges 107. In some aspects, electronics boards 333 in different cartridges 107 may be visually similar or difficult to distinguish visually. Indexing features 339 may be included to facilitate distinction between cartridges 107 with physical similarities. The indexing feature 339 is shown as a pair of bores and a plug that may be threaded or otherwise engageable in either of the bores to vary forms of the indexing feature 339 provided in different configurations, although any other variety of indexing feature may be included to provide a physical distinction among different forms. In use, the first cartridge 107A and the third cartridge 107C may each include orientation pins and/or openings (or other indexing features 339) that may differ from one another to obstruct installation of the first cartridge 107A into the third bay 115C and the third cartridge 107C into the first bay 115A, for example.

The body 301 may vary from the body 201 in terms of structure included for alignment and/or securing of the body 301. As one example, as best seen in views 300A and 300C, the body 301 is depicted with first hanger 323A bearing a first fastener 325A and positioned along and/or inset into left side wall 203C (e.g., unlike body 201), while the second hanger 323B is shown bearing a second fastener 32BA and positioned along and/or extending beyond the rear open face 205A (e.g., similar to body 201), although other positioning relative to features of the body 301 may be implemented. Structure incorporated in and/or implemented with the body 301 may be examples of and/or interact with examples of structures that may be included in the guides of the vertical guide set 121, which may also include other structures described below.

When fully assembled (e.g., as best seen in view 300D in FIG. 3B), a notch 341 may be defined between the cover 335 and the secondary set 117B of forwardly-oriented connectors 117 borne by the electronics board 333. A recessed surface 343 may be positioned over the notch 341, such as formed by extensions of the cover 335. As may best be seen in the top view 300C in FIG. 3B, an alignment aperture 345 may be included, such as in the recessed surface 343 (and/or over the notch 341 visible in FIG. 3B). The alignment aperture 345 may provide an engagement structure opposite the first hanger 323, e.g., with the alignment aperture 345 adjacent the right lateral side wall 303B and with the first hanger 323A adjacent the left lateral wall 303C. A groove 347 may be formed, e.g., inset into the left lateral wall 303C. The groove 347 may be positioned beneath the first hanger 323A, for example.

Unlike the cabling 213 depicted in FIG. 2A arranged in a one-to-one arrangement, the cabling 313 is shown in the exploded view 300B in FIG. 3A in a multiple-to-multiple arrangement. However, the cabling 213 and 313 may be arranged in a matching or differing arrangement and may include any one-to-one, one-to-multiple, multiple-to-multiple, branching, direct, or other arrangement in use for coupling relevant subsets.

Figure 4:
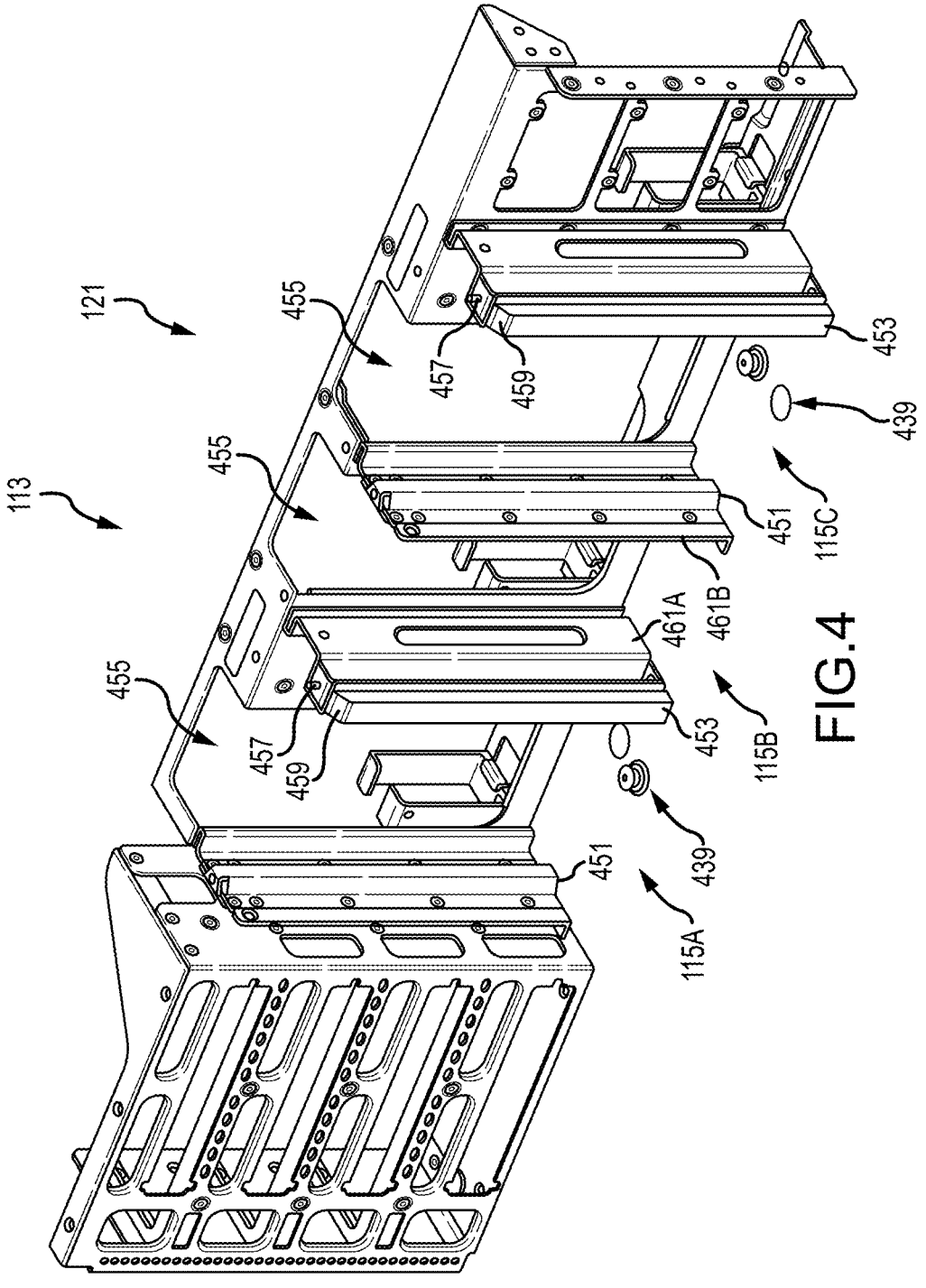
FIG. 4 depicts a midplane frame may be included in the system of FIG. 1 according to various embodiments.

FIG. 4 depicts a midplane frame 113 that may be included. The midplane frame 113 may include structures that may be examples of guides included in the vertical guide set 121.

The first bay 115A and the third bay 115C are show with similar peripheral structure. For example, a post 451 is shown along a left side, while a column 453 is shown along a right side, and a cutout 455 is shown along a rear side.

The post 451 may be suitably sized and shaped for being received in the groove 347 discussed with respect to FIG. 3A. For example, the post 451 may include a wedge-shape that extends along its height, which may match a wedge shape of the groove 347 to facilitate alignment and sliding.

The column 453 may be suitably shaped to be received in the notch 341 discussed with respect to FIG. 3B. Atop the column 453 may be a protrusion 457 suitably sized for engaging the alignment aperture 345. A ramped surface 459 may be included and may facilitate engagement of the secondary set 117B of forwardly-oriented connectors 117 of the electronics board 333 during lowering to direct movement to receive the notch 341 over the column 453 and/or to align the protrusion 457 with the alignment aperture 345.

The cutout 455 may be sized to receive the cabling 313 discussed with respect to FIG. 3A. For example, the cutout 455 may be sized to receive a portion of the cabling 313 extending out from the body 301.

The first bay 115A and the third bay 115C may include differing indexing features 439 from each other. The indexing features 439 may correspond to mating features for the indexing features 339 of the body 301. For example, in FIG. 4, the indexing features 439 in the first bay 115A are shown with a pin positioned more forwardly than a pin of the indexing features 439 in the third bay 115C, although any other combination of features may be implemented to obstruct installation of the first cartridge 107A into the third bay 115C and/or of the third cartridge 107C into the first bay 115A.

The second bay 115B is shown with structure suitable for engaging features included with the body 201. The second bay 115B is shown with a left bracket 461A along a left side, a right bracket 461B along a right side, and a cutout 455 along a rear-side. The cutout 455 along the second bay 115B may be sized to receive the cabling 213 discussed with respect to FIG. 2A. For example, the cutout 455 along the second bay 115B may be sized to receive a portion of the cabling 213 extending out from the body 201. The cutout 455 of the second bay 115B may be similar or different in size and/or shape relative to the cutout 455 of the first bay 115A and/or the third bay 115C, e.g., which may correspond to differences or similarities between the cabling 213 and 313. The left bracket 461A and the right bracket 461B may include features that are more readily visible in FIG. 5.

Figure 5:
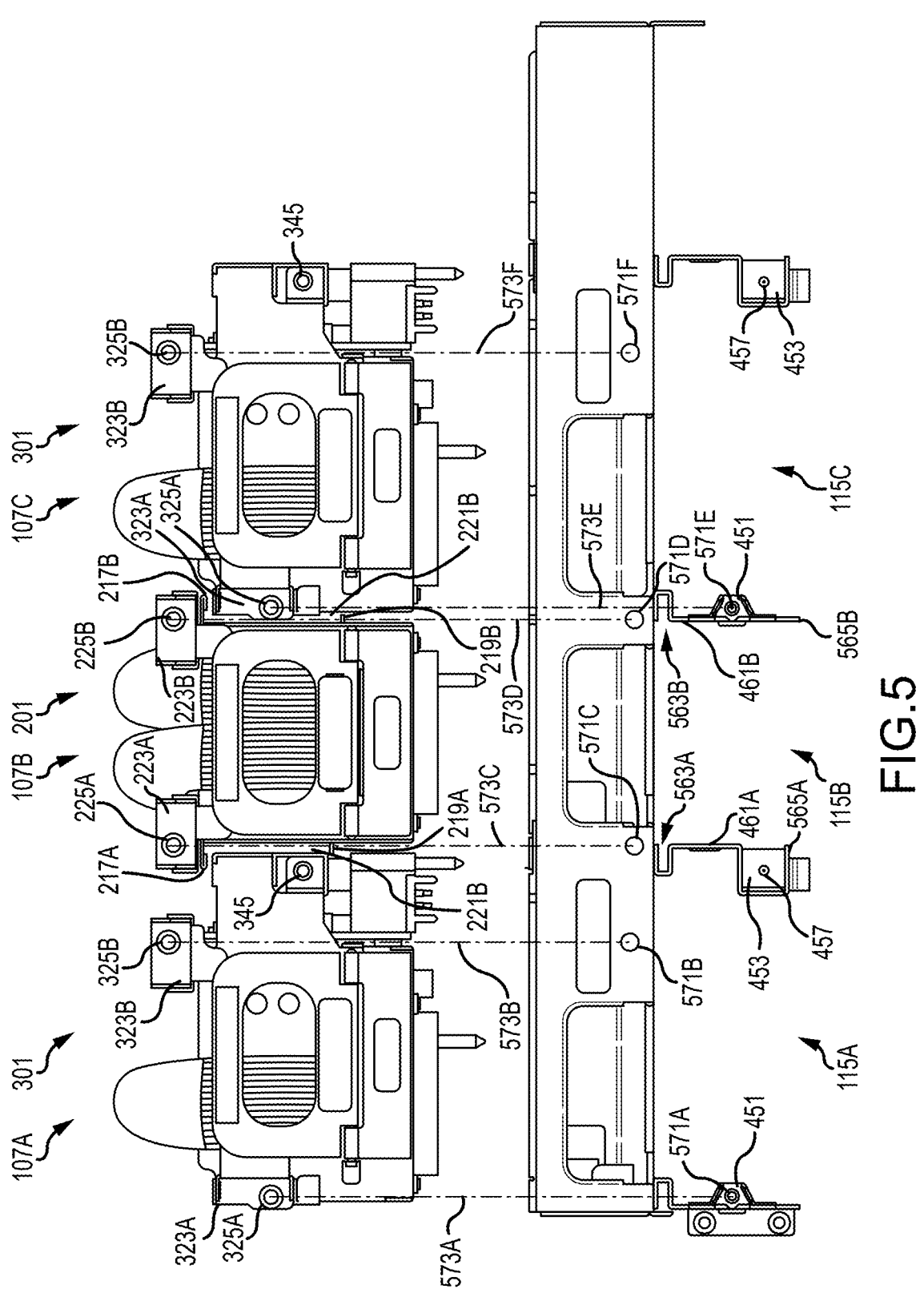
FIG. 5 depicts a top view of components that may be aligned for installation relative to the midplane frame of FIG. 4 according to various embodiments.

FIG. 5 depicts a top view of components for case of discussing alignment. For example, FIG. 5 depicts a top view of the first bay 115A, the second bay 115B, and the third bay 115C, as well as the first cartridge 107A (e.g., which may include the body 301 associated components), the second cartridge 107B (e.g., which may include the body 201 associated components), and the third cartridge 107C (e.g., which may include the body 301 and associated components).

The left bracket 461A and the right bracket 461B may each define a slit 563A and 563B proximate the rear. The slits 563A and 563B may correspond to c-shapes with openings that face toward one another, for example. In use, the slits 563 may respectively receive the lateral wings 217A and 217B and may be suitably sized to do so and/or to constrain movement along a particular path.

The brackets 461A and 461B may extend to distal ends 565A and 565B. The lateral arms 219A and 219B may be spaced from the lateral wings 217A and 217B by a suitable distance to allow the resulting slot 221A therebetween to capture the distal ends 565A and 565B of the brackets 461A and 461B and/or to cause the lateral arms 219A and 219B to be received along the distal ends 565A and 565B of the brackets 461A and 461B in use, e.g., which may facilitate guiding along particular paths for alignment in use.

The brackets 461A and 461B may be arranged relative to components for other bays 115. For example, in FIG. 5, the left bracket 461A wraps at least partially around (e.g., to support and/or be supported by) the column 453 of the first bay 115A, and the right bracket 461B wraps at least partially around (e.g., to support and/or be supported by) the post 451 of the third bay 115C.

Following alignment and insertion, components may be secured in place in the midplane frame 113. Various features may facilitate securing. For example, the midplane frame 113 in FIG. 5 is shown with receiving holes 571A, 571B, 571C, 571D, 571E, and 571F.

The first receiving hole 571A may be located in a top of the post 451 of the first bay 115A. As depicted by the first alignment line 573A, the first receiving hole 571A may be arranged for receiving fastener 325A (e.g., which may be held in place by the first hanger 323A of the first cartridge 107A).

The second receiving hole 571B may be located in a portion of the midplane frame 113 that is rearward and/or rightward of a center of the first bay 115A. As depicted by the second alignment line 573B, the second receiving hole 571B may be arranged for receiving fastener 325B (e.g., which may be held in place by the second hanger 323B of the first cartridge 107A).

The third receiving hole 571C may be located in a portion of the midplane frame 113 that is rearward and/or leftward of a center of the second bay 115B. As depicted by the third alignment line 573C, the third receiving hole 571C may be arranged for receiving fastener 225A (e.g., which may be held in place by the first hanger 223A of the second cartridge 107B).

The fourth receiving hole 571D may be located in a portion of the midplane frame 113 that is rearward and/or rightward of a center of the second bay 115B. As depicted by the fourth alignment line 573D, the fourth receiving hole 571D may be arranged for receiving fastener 225B (e.g., which may be held in place by the second hanger 223B of the second cartridge 107B).

The fifth receiving hole 571E may be located in a top of the post 451 of the third bay 115C. As depicted by the fifth alignment line 573E, the fifth receiving hole 571E may be arranged for receiving fastener 325A (e.g., which may be held in place by the first hanger 323A of the third cartridge 107C).

The sixth receiving hole 571F may be located in a portion of the midplane frame 113 that is rearward and/or rightward of a center of the third bay 115C. As depicted by the sixth alignment line 573F, the sixth receiving hole 571F may be arranged for receiving fastener 325B (e.g., which may be held in place by the second hanger 323B of the third cartridge 107C).

Installing the first cartridge 107A, the second cartridge 107B, and the third cartridge 107C in the midplane frame 113 additionally or alternatively may cause alignment of other features. Some examples may include structures discussed previously, such as with respect to FIG. 4. As one illustrative example, installing may cause the alignment aperture 345 of the first cartridge 107A to align with and engage the protrusion 457 atop the column 453 of the first bay 115A and/or may cause the alignment aperture 345 of the third cartridge 107C to align with and engage the protrusion 457 atop the column 453 of the third bay 115C. As a result of installation, various alignment and/or fastening structures may be visible from above, including but not limited to those identified again by number in FIG. 6.

Figure 6:
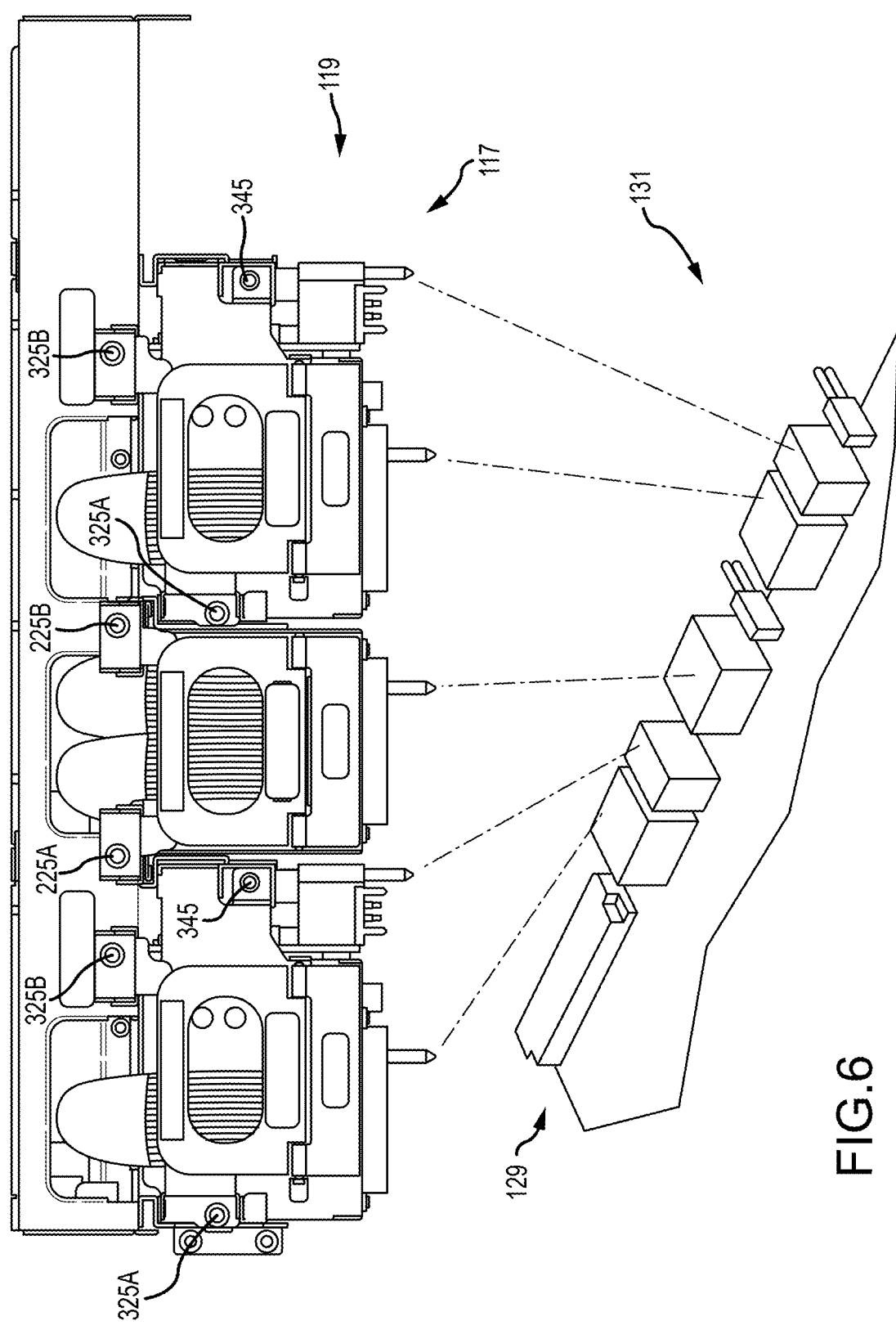
FIG. 6 depicts a top view of components of FIG. 5 in an installed state according to various embodiments.

FIG. 6 depicts a top view of components of FIG. 5 in an installed state according to various embodiments. FIG. 6 may correspond to an example of a landed arrangement. For example, in the landed arrangement, rows 119 of forwardly-oriented connectors may be suitably arranged for engaging rows 129 of rearwardly-oriented connectors referenced in FIG. 1.

FIG. 7 is a block diagram illustrating a process 700 that may be performed relative to components described herein. Although examples of particular numbers of components may be included in this discussion, it is to be understood that other combinations of numbers may be utilized. For example, although discussion herein primarily references three cartridges with four rows that match rows from four appliances, other numbers of cartridges, rows, and/or appliances may be utilized.

At 710, the process 700 may include accessing a rack-mountable enclosure containing a midplane frame defining at least one bay. This may include (e.g., with reference to FIG. 1) accessing a rack-mountable enclosure 103 extending in a length direction 109A, a width direction 109B, and a height direction 109C and containing a midplane frame 113 defining a first bay 115A, a second bay 115B, and a third bay 115C aligned alongside one another in the width direction 109B.

At 720, the process 700 may include accessing a set of cartridges each having forwardly-oriented connectors arrayed in rows arranged in a stack in the height direction. This may include (e.g., with reference to FIG. 1) accessing a set of cartridges 107 (e.g., a first cartridge 107A, a second cartridge 107B, and a third cartridge 107B) each having forwardly-oriented connectors 117 arrayed in four rows 119A, 119B, 119C, and 119D arranged in a stack in the height direction 109C.

At 730, the process 700 may include lowering the set of cartridges along the height direction into the midplane frame into a landed arrangement. This may include (e.g., with reference to FIG. 1) lowering the set of cartridges 107 along the height direction 109C into the midplane frame 113 into a landed arrangement (e.g., FIG. 6). In the landed arrangement, the four rows 119A, 119B, 119C, and 119D of forwardly-oriented connectors 117 may be aligned across the set of cartridges 107 in the midplane frame 113. The lowering may include lowering a first cartridge 107A into the first bay 115A, lowering a second cartridge 107B into the second bay 115B, and lowering a third cartridge 107C into the third bay 115C.

Other operations may be performed with the cartridges in the landed arrangement. In some embodiments, the process 700 may include, with the set of cartridges 107 in the landed arrangement, folding down handles 215 and/or 315 positioned atop the cartridges 107. The handles 215 and/or 315 may be arranged to facilitate holding the cartridges 197 from above for lowering the cartridges 107 relative to the midplane frame 113, for example. In some embodiments, the process 700 may additionally or alternatively include, with the set of cartridges 107 in the landed arrangement, accessing fasteners 225A, 225B, 325A, 325B received in hangers 223A, 223B, 323A, 323B on the cartridges 107 (e.g., as shown in FIGS. 2A and 3A) and driving the fasteners 225A, 225B, 325A, 325B into engagement (e.g., as represented in FIG. 5 by lines 573A, 573B, 573C, 573D, 573E, and 573F) with receiving holes 571A, 571B, 571C, 571D, 571E, and 571F in the midplane frame 113.

At 740, the process 700 may include accessing a set of computing appliances each having a row of rearwardly-oriented connectors. This may include (e.g., with reference to FIG. 1) accessing a set of four computing appliances 105A, 105B, 105C, and 105D each having a row 129 of rearwardly-oriented connectors 131.

At 750, the process 700 may include moving the set of computing appliances rearwardly in the enclosure into a seated arrangement in which the computing appliances are stacked over one another and in which the rows of rearwardly-oriented connectors of the computing appliances are coupled with the rows of the forwardly-oriented connectors of the set of cartridges. This may include (e.g., with reference to FIG. 1) moving the set of four computing appliances 105A, 105B, 105C, and 105D rearwardly along the length direction 109A in the enclosure 103 into a seated arrangement in which the four computing appliances 105A, 105B, 105C, and 105D are stacked over one another in the height direction 109C and in which the rows 129 of rearwardly-oriented connectors 131 of the four computing appliances 105A, 105B, 105C, and 105D are coupled with the four rows 119A, 119B, 119C, and 119D of the forwardly-oriented connectors 117 of the set of cartridges 107.

In some embodiments, moving the set of four computing appliances 105A, 105B, 105C, and 105D rearwardly causes the four computing appliances 105A, 105B, 105C, and 105D to be connected to each other by a first set of cables 313 of the first cartridge 107A, a second set of cables 213 of the second cartridge 107B, a third set of cables 313 of the third cartridge 107A and to be connected with a clock generator incorporated into an electronics board 333 of the first cartridge 107A and with an ethernet switch incorporated into an electronics board 333 of the third cartridge 107C.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method of installing components of a computing system, the method comprising:

accessing a rack-mountable enclosure extending in a length direction, a width direction, and a height direction and containing a midplane frame defining a first bay, a second bay, and a third bay aligned alongside one another in the width direction;

accessing a set of cartridges each having forwardly-oriented connectors arrayed in four rows arranged in a stack in the height direction;

lowering the set of cartridges along the height direction into the midplane frame into a landed arrangement in which the four rows of forwardly-oriented connectors are aligned across the set of cartridges in the midplane frame, the lowering including:

lowering a first cartridge into the first bay;

lowering a second cartridge into the second bay; and lowering a third cartridge into the third bay;

accessing a set of four computing appliances each having a row of rearwardly-oriented connectors; and moving the set of four computing appliances rearwardly along the length direction in the enclosure into a seated arrangement in which the four computing appliances are stacked over one another in the height direction and in which the rows of rearwardly-oriented connectors of the four computing appliances are coupled with the four rows of the forwardly-oriented connectors of the set of cartridges.

2. The method of claim 1, wherein the moving the set of four computing appliances rearwardly causes the four computing appliances to be connected to each other by a first set of cables of the first cartridge, a second set of cables of the second cartridge, a third set of cables of the third cartridge and to be connected with a clock generator incorporated into an electronics board of the first cartridge and with an ethernet switch incorporated into an electronics board of the third cartridge.

3. The method of claim 1, further comprising, with the set of cartridges in the landed arrangement, folding down handles positioned atop the cartridges, the handles arranged to facilitate holding the cartridges from above for lowering the cartridges relative to the midplane frame.

4. The method of claim 1, further comprising, with the set of cartridges in the landed arrangement, accessing fasteners received in hangers on the cartridges and driving the fasteners into engagement with receiving holes in the midplane frame.

5. A system, comprising:

a rack-mountable enclosure extending in a length direction, a width direction, and a height direction;

a midplane frame contained in the enclosure, extending at least in the width direction, and defining at least a first bay;

a first cartridge receivable in the first bay in a landed position, the first cartridge having forwardly-oriented connectors arrayed in rows arranged in a stack in the height direction;

a vertical guide set comprising guides distributed among the first cartridge and the midplane frame and arranged to facilitate aligned vertical movement of the first cartridge along the height direction into and out of the first bay; and a plurality of appliances each having a row of one or more rearwardly-oriented connectors, each of the plurality of appliances being movable rearwardly along the length direction in the enclosure into a seated arrangement in which the plurality of appliances are stacked over one another in the height direction and in which the rows of one or more rearwardly-oriented connectors of the appliances are coupled with the rows of the forwardly-oriented connectors of the first cartridge in the landed position.

6. The system of claim 5, wherein the midplane frame defines the first bay, a second bay, and a third bay aligned alongside one another in the width direction.

7. The system of claim 6, wherein the first cartridge is included in a cartridge set that further comprises:

a second cartridge sized for receipt in the second bay; and a third cartridge sized for receipt in the third bay.

8. The system of claim 7, wherein the guides of the vertical guide set are distributed among the cartridge set and the midplane frame and are arranged to facilitate aligned vertical movement into a landed arrangement in which the cartridge set is received in the midplane frame with the rows of forwardly-oriented connectors aligned across the cartridge set.

9. The system of claim 8, wherein:

the plurality of appliances includes four computing appliances;

the forwardly-oriented connectors of the cartridge set are arrayed in four rows stacked over one another in the height direction; and in the seated arrangement, the row of one or more rearwardly-oriented connectors of each of the four computing appliances is coupled with a different one of the four rows of the forwardly-oriented connectors of the cartridge set.

10. The system of claim 7, wherein the first cartridge, the second cartridge, and the third cartridge each include cabling, and wherein the first cartridge and the third cartridge each further comprise an electronics board.

11. The system of claim 10, wherein the first cartridge and the third cartridge each include respective indexing assemblies that differ from one another to obstruct installation of the first cartridge into the third bay and the third cartridge into the first bay.

12. The system of claim 5, wherein the first cartridge comprises a body comprising a front wall, lateral side walls, and a top wall, wherein the front wall is penetrated by openings that are distributed in the height direction and that are sized for receiving the forwardly-oriented connectors;

wherein at least some of the guides of the vertical guide set are distributed along the body; and wherein the first cartridge further comprises a foldable handle coupled with the top wall of the body and reconfigurable between a stowed arrangement, in which the handle is arranged laying flat along or within the top wall, and a deployed state, in which the handle is arranged extending upward from the top wall to facilitate grasping for lowering or raising the body relative to the first bay of the midplane frame.

13. A cartridge configured to be vertically installed into a midplane frame to facilitate connectivity among appliances installable horizontally relative to the midplane frame, the cartridge comprising:

a body comprising a front wall, lateral side walls, and a top wall, wherein the front wall is penetrated by openings that are distributed in a height direction and that are sized for receiving connectors;

a vertical guide set comprising guides distributed along the body and arranged to facilitate aligned vertical movement of the body along the height direction into and out of a bay of the midplane frame; and a foldable handle coupled with the top wall of the body and reconfigurable between a stowed arrangement, in which the handle is arranged laying flat along or within the top wall, and a deployed state, in which the handle is arranged extending upward from the top wall to facilitate grasping for lowering or raising the body relative to the bay of the midplane frame.

14. The cartridge of claim 13, further comprising a set of shelves each positioned below a different one of the openings and sized for supporting one of the connectors in a position extending through the front wall.

15. The cartridge of claim 13, wherein airflow passages are defined through portions of the front wall between the openings.

16. The cartridge of claim 13, further comprising the connectors.

17. The cartridge of claim 13, wherein the body of the cartridge comprises an open rear face sized to permit extension of cabling that couples subsets of the connectors together in an installed state.

18. The cartridge of claim 13, wherein the body further comprises a channel sized for receiving an electronics board in a position in which the connectors positioned in the openings in an installed state of the connectors are aligned in rows with connectors of the electronics board.

19. The cartridge of claim 18, further comprising the electronics board.

20. The cartridge of claim 13, further comprising at least one hanger extending from the body and bearing a fastener configured to be driven into engagement with a receiving hole in the midplane frame for securing the body of the cartridge relative to the midplane frame.

* * * * *